(12) United States Patent
Onishi et al.

(10) Patent No.: US 9,462,731 B2
(45) Date of Patent: Oct. 4, 2016

(54) COVER STRUCTURE FOR ELECTRONIC CIRCUIT MODULE

(71) Applicant: ALPS ELECTRIC CO., LTD., Tokyo (JP)

(72) Inventors: Tadaaki Onishi, Miyagi-ken (JP); Yoshio Sugimori, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/186,639

(22) Filed: Feb. 21, 2014

(65) Prior Publication Data
US 2014/0301043 A1    Oct. 9, 2014

(30) Foreign Application Priority Data
Apr. 8, 2013 (JP) .............................. 2013-001959 U

(51) Int. Cl.
H05K 7/00    (2006.01)
H05K 9/00    (2006.01)

(52) U.S. Cl.
CPC ............ *H05K 9/0026* (2013.01); *H05K 9/006* (2013.01)

(58) Field of Classification Search
CPC ..... H05K 9/0026; H01L 23/02; H01L 25/00; H01L 2924/16152
See application file for complete search history.

(56) References Cited

U.S. PATENT DOCUMENTS

| | | | |
|---|---|---|---|
| 7,053,295 B2 * | 5/2006 | Murasawa | .......... H01L 23/4006 174/358 |
| 7,764,513 B2 * | 7/2010 | Miyamoto et al. | ........... 361/816 |
| 8,614,119 B2 * | 12/2013 | Fukuda | ................. H01L 21/561 438/106 |
| 9,247,682 B2 * | 1/2016 | Watanabe | ............ H05K 9/0043 |
| 2007/0205492 A1 * | 9/2007 | Wang | ............................ 257/659 |
| 2013/0322040 A1 * | 12/2013 | Watanabe | ..................... 361/760 |

FOREIGN PATENT DOCUMENTS

JP    2001-36278    2/2001

* cited by examiner

*Primary Examiner* — Robert J Hoffberg
*Assistant Examiner* — Hung Dang
(74) *Attorney, Agent, or Firm* — Beyer Law Group LLP

(57) ABSTRACT

A cover structure for an electronic circuit module includes a circuit board and a box-shaped cover integrated to each other. An electronic component is mounted on the circuit board. The cover has at least one open side. The cover includes a top plate and a mounting leg. The top plate is disposed so as to oppose the circuit board. The mounting leg is joined to the circuit board. The mounting leg is bent and extends from an outer periphery of the top plate. The top plate includes a bend portion and a cutaway portion. The bend portion is connected to the mounting leg. The cutaway portion is provided near the bend portion.

8 Claims, 5 Drawing Sheets

COVER STRUCTURE FOR ELECTRONIC CIRCUIT MODULE

CLAIM OF PRIORITY

This application claims benefit of Japanese Utility Model Registration Application No. 2013-001959 filed on Apr. 8, 2013, which is hereby incorporated by reference.

BACKGROUND OF THE DEVICE

1. Field of the Device

The present device relates to a cover structure for an electronic circuit module.

2. Description of the Related Art

For example, in a television tuner, an entire electronic circuit portion that handles high-frequency signals is covered with a metallic cover for electromagnetically shielding the electronic circuit portion from an external environment. A portion of the cover is soldered to a substrate of an electronic circuit. In order to increase soldering performance, various methods are proposed.

As one method, in order to prevent dispersion of solder heat at a soldering portion of the cover, providing a through hole near the soldering portion of the cover is generally known.

FIG. 5 shows a portion of an existing cover structure 901 that is described in Japanese Unexamined Patent Application Publication No. 2001-36278. A through hole 902a is provided near a projecting portion 902b of a shield plate 902, which is part of a cover. The projecting portion 902b and a substrate 903 are joined to each other with solder 904.

However, when, in the existing cover structure 901, an outside force generated by, for example, handling is transmitted to the shield plate 902, the shield plate 902 is deformed. This causes even the projecting portion 902b, which is provided in the same plane as the shield plate 902, to be deformed. Therefore, an outside force resulting from the deformation of the projecting portion 902b is also transmitted to the solder 904 that joins the projecting portion 902b and the substrate 903 to each other. This may cause the solder 904 to crack.

SUMMARY OF THE DEVICE

To overcome the above-described problem, the present device provides a cover structure for an electronic circuit module in which even if an outside force is transmitted to a cover, solder that joins the cover and a circuit board is not cracked.

To this end, according to an aspect of the present device, there is provided a cover structure for an electronic circuit module including a circuit board and a box-shaped cover integrated to each other. An electronic component is mounted on the circuit board. The cover has at least one open side. The cover includes a top plate and a mounting leg. The top plate is disposed so as to oppose the circuit board. The mounting leg is joined to the circuit board. The mounting leg is bent and extends from an outer periphery of the top plate. The top plate includes a bend portion and a cutaway portion. The bend portion is connected to the mounting leg. The cutaway portion is provided near the bend portion.

According to this structure, the cover structure for the electronic circuit module is provided with a cutaway portion near the bend portion that is connected to the mounting leg. Therefore, even if an outside force is transmitted to the top plate of the cover, the cutaway portion that is provided in a portion of the top plate near the bend portion prevents the outside force from being transmitted to the mounting leg that extends from the bend portion. Consequently, the mounting leg is not deformed, as a result of which the solder at a connection portion where the mounting leg is soldered does not crack.

In the cover structure for the electronic circuit module according to the present device, the top plate may be an octagonal plate in which each inside angle of the top plate is 135 degrees, the cover may include a plurality of the mounting legs bent from four short sides of the top plate that are not next to each other, and the cover may further include a plurality of side plates bent from four sides other than the short sides.

According to this structure, since the cover structure of the electronic circuit module includes a plurality of side plates, the rigidity of the cover is increased, so that the cover is unlikely to be deformed. Since the cutaway portions that are provided near the bend portion are provided at the short sides of the top plate from which the mounting legs extend, an outside force that is applied to the top plate is unlikely to be transmitted to the mounting legs. Therefore, deformation of the mounting legs is suppressed.

In the cover structure for the electronic circuit module according to the present device, each mounting leg may include a thin end portion at an end thereof. In addition, each end portion may be inserted into a corresponding land insertion hole provided in the circuit board, and each mounting leg may be soldered to the circuit board. Further, the side plates are preferably not soldered to the circuit board.

According to this structure, since the position of each end portion is fixed, the mounting legs are not deformed. Since the side plates are not soldered to the circuit board, even if the side plates are deformed, this does not influence their connections with the circuit board. As described above, the side plates make it possible to reduce the amount of deformation of the cover. In addition, the mounting legs are firmly secured to the circuit board, and the cutaway portions are provided so that the mounting legs do not move even if the top plate is slightly deformed. By the overall action of these portions, the mounting legs are not deformed, so that it is possible to prevent the solder from cracking.

In the cover structure for the electronic circuit module according to the present device, the top plate may include four cutaway portions, and a contour of each cutaway portion may have a trapezoidal shape in accordance with an outside shape of a portion of the top plate near the bend portion.

According to this structure, it is unlikely for the mounting legs to be influenced by the deformation of the top plate. In addition, it is possible to prevent heat that is generated when soldering is performed from escaping to the top plate from the mounting legs. Therefore, soldering is facilitated.

In the cover structure for the electronic circuit module according to the present device, the top plate preferably does not include any opening other than the four cutaway portions.

According to this structure, since air flows from a corner to another corner in the cover, heat dissipation characteristics in the cover approach a uniform state.

In the cover structure for the electronic circuit module according to the present device, a short-side direction width of each cutaway portion may be from 0.1 mm to 0.5 mm.

According to this structure, it is possible to prevent heat that is generated when soldering is performed from escaping to the top plate from the mounting legs. Therefore, soldering is facilitated. In addition, it is possible to intercept electromagnetic noise.

The cover structure for the electronic circuit module according to the present device is provided with a cutaway portion near the bend portion that is connected to the mounting leg. Therefore, even if an outside force is transmitted to the top plate of the cover, the cutaway portion that is provided in a portion of the top plate near the bend portion prevents the outside force from being transmitted to the mounting leg that extends from the bend portion. Consequently, the mounting leg is not deformed. Therefore, it is possible to provide a cover structure for an electronic circuit module in which, even if an outside force is transmitted to the cover, solder that joins the cover and the circuit board to each other is not cracked.

DESCRIPTION OF THE PREFERRED EMBODIMENTS

Figure 1:
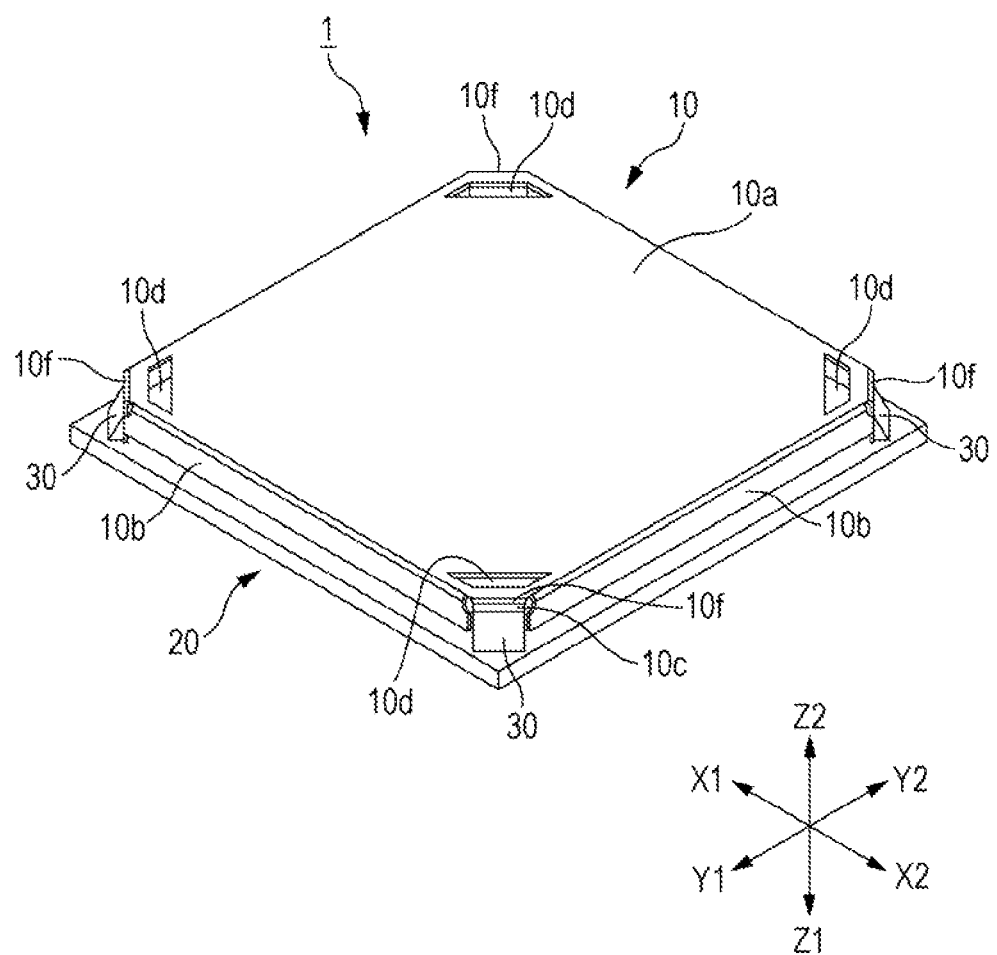
FIG. 1 is a perspective view of a cover structure for an electronic circuit module according to an embodiment of the present device.
Figure 2:
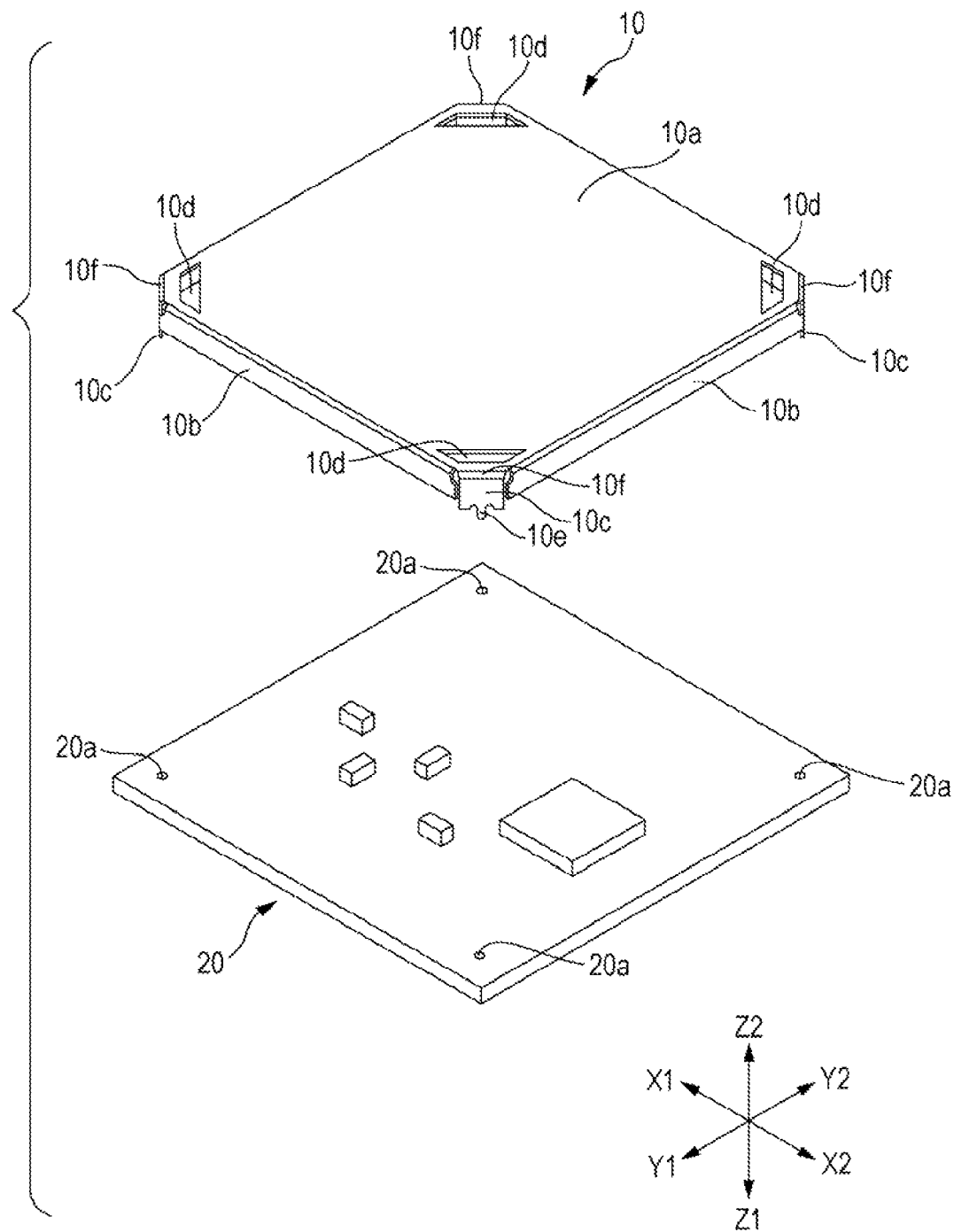
FIG. 2 is an exploded perspective view of the cover structure for the electronic circuit module according to the embodiment of the present device.
Figure 3A:
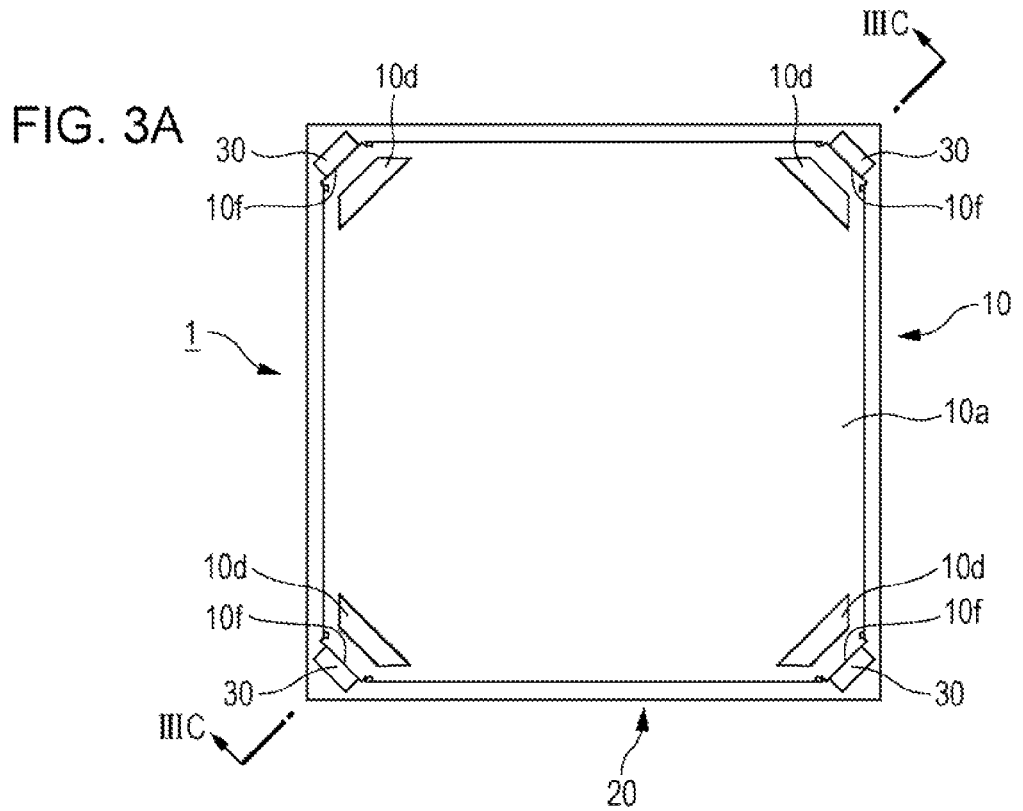
FIGS. 3A to 3C are schematic views for describing the cover structure for the electronic circuit module according to the embodiment of the present device, with FIG. 3A being a plan view, FIG. 3B being a side view, and FIG. 3C being a sectional view taken along line IIIC-IIIC of FIG. 3A.
Figure 3B:
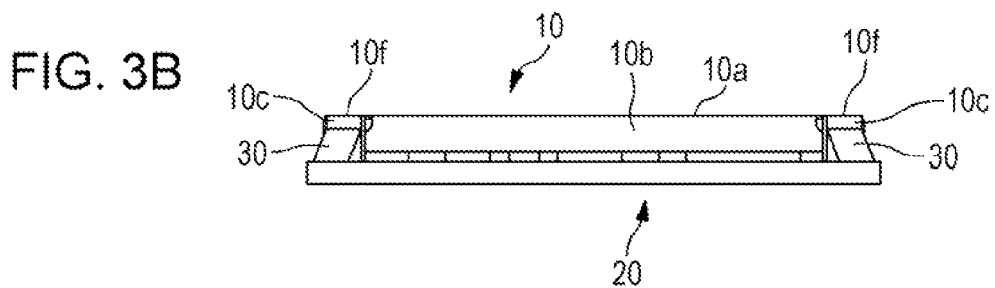
Figure 3C:
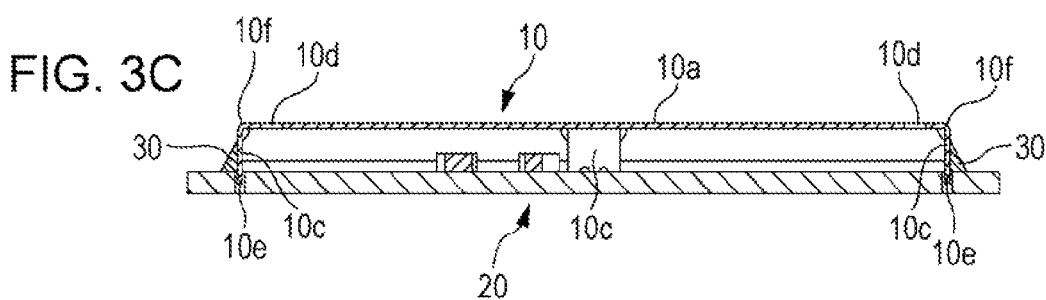

An embodiment according to the present device is hereunder described with reference to the attached drawings. FIG. 1 is a perspective view of a cover structure for an electronic circuit module 1 according to an embodiment of the present device. FIG. 2 is an exploded perspective view of the cover structure for the electronic circuit module 1 according to the embodiment of the present device. FIGS. 3A to 3C are schematic views for describing the cover structure for the electronic circuit module 1 according to the embodiment of the present device, with FIG. 3A being a plan view, FIG. 3B being a side view, and FIG. 3C being a sectional view taken along line IIIC-IIIC of FIG. 3A.

As shown in FIG. 1, in the cover structure for the electronic circuit module 1, a box-shaped cover 10 is joined and integrated to a circuit board 20 with solder 30 so as to cover the circuit board 20. As shown in FIG. 2, electronic components and wires thereof are mounted on the circuit board 20 that is covered with the box-shaped cover 10. The cover structure for the electronic circuit module 1 has a form that is effective for electromagnetic shielding of the electronic components and the wires thereof from an external environment as a result of joining the cover 10 with the solder 30 so as to cover the circuit board 20. FIG. 2 does not show the solder 30.

The cover 10 is formed by processing a thin steel plate. As shown in FIG. 2, the cover 10 includes a top plate 10a, side plates 10b, and mounting legs 10c. The side plates 10b and the mounting legs 10c are bent and extend from an outer periphery of the top plate 10a. The cover 10 has a box shape in which a circuit-board-20 side (Z1 side) of the cover 10 is open and the top plate 10a is disposed so as to oppose the circuit board 20.

As shown in FIG. 3A, the top plate 10a is an octagonal plate whose inside angles are all 135 degrees in plan view, and whose four sides that are not next to each other are short sides that are shorter than the other four sides. The short sides of the top plate 10a form bend portions 10f, and are connected to the mounting legs 10c. The top plate 10a is provided with cutaway portions 10d that are provided inwardly of the bend portions 10f. As shown in FIGS. 3B and 3C, the mounting legs 10c are bent and extend from the bend portions 10f at the short sides of the top plate 10a. The side plates 10b are bent and extend from the four sides other than the short sides of the top plate 10a.

As shown in FIG. 2 and FIG. 3A, the bend portions 10f having widths that correspond to the widths of the mounting legs 10c are formed at the four corners of the outer periphery of the top plate 10a. The cutaway portions 10d are openings that are formed in the top plate 10a at locations that are situated slightly inwardly from the bend portions 10f (that is, towards the center of the top plate 10a). The cutaway portions 10d are openings that are considerably smaller than the length of one side of the top plate 10a. The cutaway portions 10d have trapezoidal shapes in accordance with the outside shape of portions of the top plate 10a near the bend portions 10f. The size of each cutaway portion 10d needs to be smaller than the wavelength of an electromagnetic wave that is assumed for electromagnetic shielding from the external environment. Each opening has, for example, a longitudinal-direction size of 1 mm, and a short-side direction size of 0.2 mm. A short-side direction width needs to be as small as possible in a range in which heat that is generated when the solder fuses is unlikely to be transmitted. Therefore, it is desirable that the width be in the range of from 0.1 mm to 0.5 mm. If heat generated during the operation of the electronic circuit module 1 can escape when air flows into the cover 10 via the cutaway portions 10d, the cutaway portions 10d are provided at four corners of the top plate 10a, and other portions of the top plate 10a do not have openings. Therefore, the air flows from a corner to another corner in the cover 10, and heat dissipation characteristics in the cover 10 approach a uniform state.

As shown in FIG. 2, thin end portions 10e are provided at ends of the mounting legs 10c of the cover 10. Each end portion 10e has a shape that allows it to be inserted into a corresponding land insertion hole 20a formed in the circuit board 20. This makes it possible to temporarily secure the cover 10 so as to cover the circuit board 20 by inserting the end portions 10e into the corresponding land insertion holes 20a. By fusing the solder 30 in this state, as shown in FIG. 1 and FIGS. 3A to 3C, it is possible to solder the mounting legs 10c.

In the cover structure for the electronic circuit module 1 according to the embodiment of the present device, the top plate 10a is provided with the cutaway portions 10d provided near the bend portions 10f that are connected to the mounting legs 10c. When the cutaway portions 10d are pushed towards the center of the top plate 10a by an outside force, the cutaway portions 10d act to prevent the outside force from being transmitted to the mounting legs 10c.

Figure 4A:
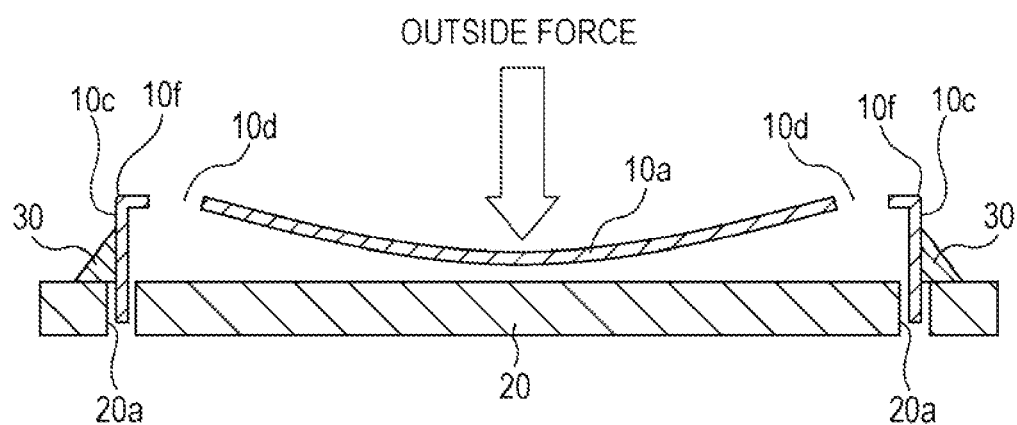
FIGS. 4A and 4B are schematic views for describing deformation of a top plate when an outside force is applied to the center of the top plate and for describing its influence on mounting legs, with FIG. 4A being a sectional view of an example according to the embodiment and FIG. 4B being a sectional view of a comparative example in which cutaway portions are not formed.
Figure 4B:
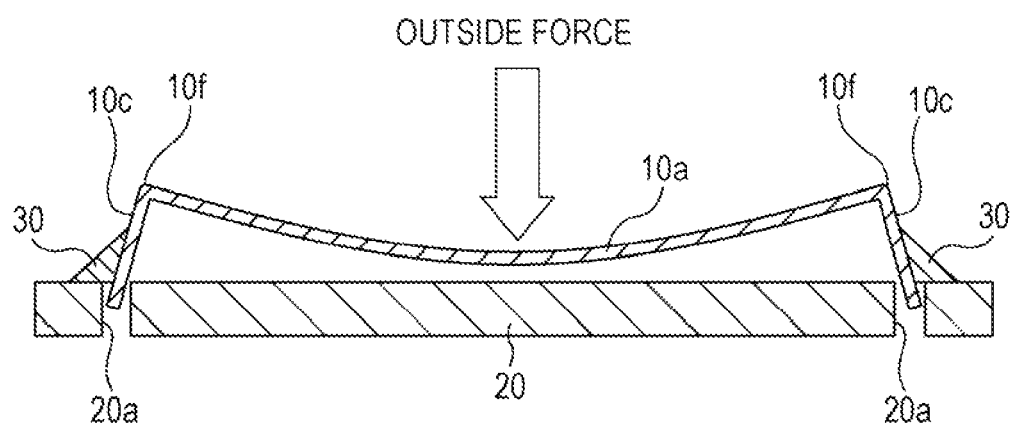
Figure 5:
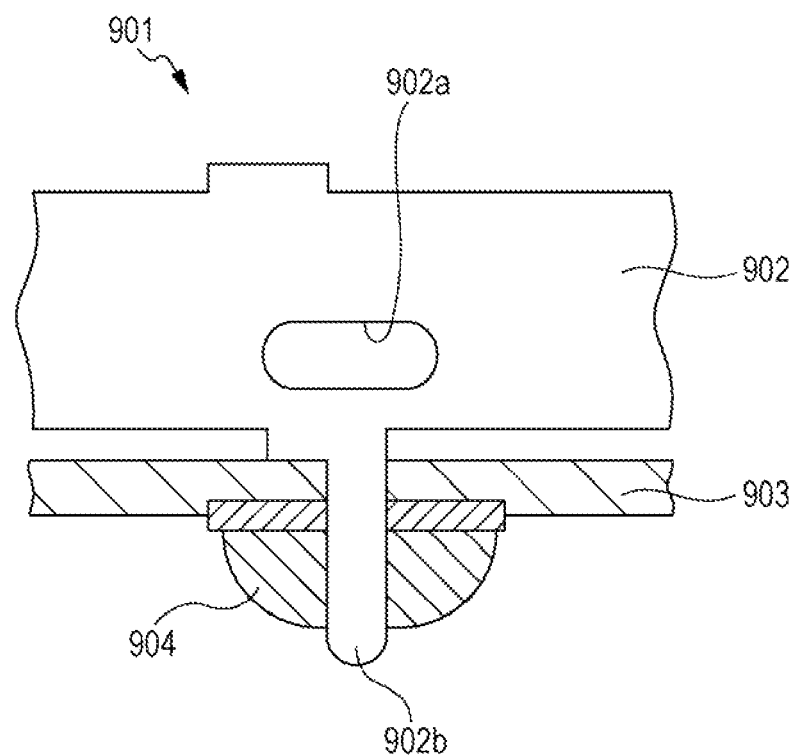
FIG. 5 is a schematic view for describing an existing cover structure.

This action is described using FIGS. 4A and 4B. FIGS. 4A and 4B are schematic views for describing deformation of the top plate 10a when an outside force is applied to the center of the top plate 10a and for describing its influence on the mounting legs 10c, with FIG. 4A being a sectional view of an example according to the embodiment and FIG. 4B being a sectional view of a comparative example in which cutaway portions are not formed.

As shown in FIG. 4B, in the comparative example in which cutaway portions 10d are not provided, when the top plate 10a is deformed, an outside force is transmitted to the bend portions 10f, as a result of which the mounting legs 10c are deformed. Since the mounting legs 10c are deformed, cracks may occur in the solder 30 at a connection portion where the mounting legs 10c are soldered.

However, according to the embodiment, as shown in FIG. 4A, the cutaway portions 10d intercept the outside force, so that only a slight amount of outside force is transmitted to the bend portions 10f. Therefore, since the mounting legs 10c are hardly deformed, the solder 30 at the connection portion where the mounting legs 10c are soldered is unlikely to be cracked.

In the cover structure for the electronic circuit module 1 according to the embodiment, as shown in FIGS. 1 to 3C, the top plate 10a includes the side plates 10b that are bent and extend from the four sides other than the four short sides of the hexagonal shape that are not next to each other. The side plates 10b suppress the deformation of the outer periphery of the top plate 10a. For example, even if an outside force is applied to the center of the top plate 10a, the shape of the outer periphery of the top plate 10a when viewed from the sides is substantially maintained by the side plates 10b. In addition, even if a shock is applied so as to apply an outside force to the outer periphery of the top plate 10a, since the side plates 10b are provided, the rigidity of the cover 10 is increased, so that the cover 10 is unlikely to be deformed.

In the cover structure for the electronic circuit module 1 according to the embodiment, the mounting legs 10c are bent and extend from the outer periphery of the top plate 10a, and the top plate 10a includes the bend portions 10f, which are connected to the mounting legs 10c, and the cutaway portions 10d, which are provided near the bend portions 10f.

Further, as viewed from above the top plate 10a, the cover for the electronic circuit module 1 according to the embodiment has the shape of an octagonal plate formed by cutting the four corners of a rectangular shape. The cover 10 includes the side plates 10b that are bent and extend from the outer periphery of the top plate 10a. The mounting legs 10c of the cover 10 extend from the corresponding short sides of the top plate 10a.

In the cover structure for the electronic circuit module 1 according to the embodiment, the cover 10 may be formed of other types of metallic materials, such as a copper plate.

The side plates 10b and the mounting legs 10c of the cover 10 need not be disposed so as to extend along the outer periphery of the top plate 10a. For example, the cover structure may include a box-shaped cover having two open sides so that a connector for connecting an electronic component, mounted on the circuit board, and an external electronic circuit to each other is provided on one of the four side plates 10b. Even in such a case, it is desirable that the cover structure be one in which the circuit board is covered so that a gap is smaller than the wavelength of an electromagnetic wave that is assumed for electromagnetic shielding from the external environment.

The shape of the top plate 10a of the cover 10 when viewed from above the top plate 10a may be an octagonal shape formed by cutting four corners of a square shape. In sum, what is required is that there be four short sides that are not next to each other and that sides that are longer than the four short sides be interposed between the four short sides.

The cover structure for the electronic circuit module according to the embodiment may be applied to other types of electronic circuit modules, such as a wireless local area network (wireless LAN), in addition to a television tuner.

The present device may be applied to an electronic circuit module in which a cover is joined to a circuit board with solder.

What is claimed is:

1. A cover structure for an electronic circuit module, the cover structure comprising:
   a circuit board having an electronic component mounted thereon; and
   a cover having an open-box shape with at least one open side, the cover being integrated with the circuit board, the cover including:
      a top plate facing the circuit board, the top plate being an octagonal plate having four short sides and four long sides alternately provided;
      a plurality of side plates bent from the four long sides of the top plate; and
      a plurality of mounting legs extending from an outer periphery of the top plate, the mounting legs being bent from the four short sides of the top plate and joined to the circuit board,
   wherein the top plate includes:
      a plurality of bending portions each connected to respective one of the mounting legs; and
      a plurality of cutaway portions, each being an opening formed on the top plate in a vicinity of corresponding one of the bending portions.

2. The cover structure for the electronic circuit module according to claim 1,
   wherein each inside angle of the octagonal plate is 135 degrees.

3. The cover structure for the electronic circuit module according to claim 2,
   wherein the circuit board is provided with land insertion holes, and
   wherein each of the plurality of mounting legs includes a thin end portion at an end thereof, each end portion being inserted into a corresponding land insertion hole and soldered to the circuit board, while the side plates not being soldered to the circuit board.

4. The cover structure for the electronic circuit module according to claim 2,
   wherein the top plate includes four cutaway portions, and
   wherein each cutaway portion has a trapezoidal shape in accordance with a contour of the top plate near the bending portion.

5. The cover structure for the electronic circuit module according to claim 4,
   wherein the top plate does not include any opening other than the four cutaway portions.

6. The cover structure for the electronic circuit module according to claim 4,
   wherein a width between parallel sides of the trapezoidal shape of each cutaway portion is from 0.1 mm to 0.5 mm.

7. The cover structure for the electronic circuit module according to claim 2, wherein the four long sides correspond to four sides of a square shape, while the four short sides correspond to cut-off sides formed at four corners of the square shape by cutting off the four corners.

8. The cover structure for the electronic circuit module according to claim 1, wherein the plurality of cutaway portions are configured to prevent an outside force applied to a center portion of the top plate from being transmitted to the mounting legs.

\* \* \* \* \*